United States Patent [19]
Pronto

[11] Patent Number: 5,428,508
[45] Date of Patent: Jun. 27, 1995

[54] METHOD FOR PROVIDING ELECTROMAGNETIC SHIELDING OF AN ELECTRICAL CIRCUIT

[75] Inventor: Stephen R. Pronto, Crystal Lake, Ill.

[73] Assignee: Motorola, Inc., Schaumburg, Ill.

[21] Appl. No.: 235,613

[22] Filed: Apr. 29, 1994

[51] Int. Cl.6 .................. H05K 9/00; H01R 43/02; B23K 31/02
[52] U.S. Cl. .................................... 361/818; 29/877; 29/878; 174/35 R; 228/179.1; 228/180.1
[58] Field of Search ............... 174/35 R, 35 MS; 361/816–818; 439/607–610; 228/179.1, 180.1; 29/592.1, 878–879, 884, 876–877

[56] References Cited

U.S. PATENT DOCUMENTS

| | | | |
|---|---|---|---|
| 4,838,475 | 6/1989 | Mullins et al. | 361/818 |
| 4,890,199 | 12/1989 | Beutler | 361/424 |
| 5,055,651 | 10/1991 | Schneider et al. | 174/35 R |
| 5,170,321 | 12/1992 | Oslund et al. | 361/386 |

FOREIGN PATENT DOCUMENTS

| | | | |
|---|---|---|---|
| 0001599 | 1/1991 | Japan | 174/35 R |
| 2236215 | 3/1991 | United Kingdom | 174/35 R |

*Primary Examiner*—Bot L. Ledynh
*Attorney, Agent, or Firm*—James A. Coffing; Daniel C. Crilly

[57] ABSTRACT

An electrical circuit (101) that is disposed on a substrate (103) employs a method and apparatus for providing electromagnetic shielding of the electrical circuit (101). One or more compressible, electrically conductive contacts (107), each of which includes a substantially planar portion (201), are coupled at their respective planar portions (201) to a receptacle area (105) on the substrate (103) that substantially encircles the electrical circuit (101). A shielding enclosure (109) having a top portion (110) and a plurality of side portions (111) is positioned upon the compressible, electrically conductive contacts (107) such that the side portions (111) compress at least some of the compressible, electrically conductive contacts (107) to substantially enclose the electrical circuit (101).

6 Claims, 1 Drawing Sheet

METHOD FOR PROVIDING ELECTROMAGNETIC SHIELDING OF AN ELECTRICAL CIRCUIT

FIELD OF THE INVENTION

The present invention relates generally to electromagnetic shielding assemblies and, in particular, to a method and apparatus for providing electromagnetic shielding of an electrical circuit that is disposed on a substrate.

BACKGROUND OF THE INVENTION

A variety of electromagnetic shielding assemblies are known in the art. Such assemblies are typically constructed as either single piece assemblies or two-piece assemblies. The single piece assemblies typically have a top portion integral with a plurality of side portions that extend downwardly from the top portion. The two-piece assemblies typically have a base portion and a separate cover. The base portion provides the walls of the two-piece shielding assembly and typically includes a plurality of downward extending protrusions that are used to align the base portion during placement onto a printed circuit board. The cover typically comprises a substantially planar portion and typically includes a plurality of so-called spring fingers extending downwardly about a periphery of the cover. Both types of shielding assemblies are generally fabricated from a metallic composition, such as a tin-plated aluminum alloy.

Attachment of the single piece assemblies is typically accomplished by reflow soldering the side portions to a receptacle trace on the printed circuit board that encircles a circuit to be shielded. Solder paste (solder and flux) is placed onto the receptacle trace and circuit component solder pads. The circuit components are automatically and/or manually placed upon their corresponding pasted solder pads. The single piece shielding assembly is then manually placed onto the pasted receptacle trace. The printed circuit board is reflowed in an infra-red reflow oven such that the circuit components and the shielding assembly are electrically connected to their respective traces and pads on the circuit board.

Several problems arise with the use of such single piece shielding assemblies. First, the single piece shielding assembly requires manual placement prior to fellow. Manual placement is generally a much tower quality-—and hence, a more costly—process than automated placement. Second, height tolerances of the side portions commonly inhibit complete soldering of the side portions, thereby creating unintended apertures in the solder joint between the shielding assembly and the receptacle trace. Depending on the size of the apertures, the shielding effectiveness of the shielding assembly may be significantly degraded. Finally, the single piece shielding assembly must be de-soldered in order to gain access to the shielded circuit components. Thus, repair or replacement of a shielded component requires sufficient heating to remove the single piece shielding assembly.

Attachment of the two piece shielding assemblies is typically accomplished by soldering the base portion to a receptacle trace on the printed circuit board using a post-reflow waveline soldering process and subsequently attaching the cover to the base portion. Prior to reflow, either solder paste is placed onto the receptacle trace and the circuit component solder pads, or the receptacle trace and the solder pads are pre-tinned. The circuit components are then automatically and/or manually placed upon their corresponding solder pads. The printed circuit board is reflowed in an infra-red reflow oven to electrically connect the components to their respective pads on the circuit board. The base portion is then manually placed onto the receptacle trace by aligning the protrusions in the base portion with corresponding slots in the printed circuit board. The base portion is soldered to the receptacle trace using a known waveline soldering process. After the base portion is attached, the cover is pushed onto the base portion such that the spring fingers are securely connected to the base portion.

There exists two problems with using existing two piece shielding assemblies. First, the base portion requires manual placement prior to waveline soldering. As mentioned above, manual placement is a lower quality, more costly process than is automated placement. Secondly, soldering of the base portion is a secondary process that provides an undesired increase in the cycle time for processing component-laden printed circuit boards.

Therefore, a need exists for a method and apparatus that provide electromagnetic shielding of an electrical circuit that is disposed on a substrate, while facilitating single process reflow soldering and automated placement of an effective base portion of an electromagnetic shielding assembly. Further, an electromagnetic shielding assembly that accounts for height tolerances in the side walls of single piece assemblies would be an improvement over the prior art.

DESCRIPTION OF A PREFERRED EMBODIMENT

Generally, the present invention encompasses a method and apparatus for providing electromagnetic shielding of an electrical circuit that is disposed on a substrate. One or more compressible, electrically conductive contacts, each of which includes a substantially planar portion, are coupled at their respective planar portions to a receptacle area on the substrate that substantially encircles the electrical circuit. A shielding enclosure having a top portion and a plurality of side portions is positioned upon the contacts, such that the side portions compress at least some of the contacts to substantially enclose the electrical circuit. By shielding the electrical circuit in this manner, the present invention facilitates automated attachment of a base portion (i.e., the compressible contacts) of the shielding assembly about a periphery of the electrical circuit, in contrast to the manual base attachment procedures of prior art electromagnetic shielding assemblies.

Figure 1:
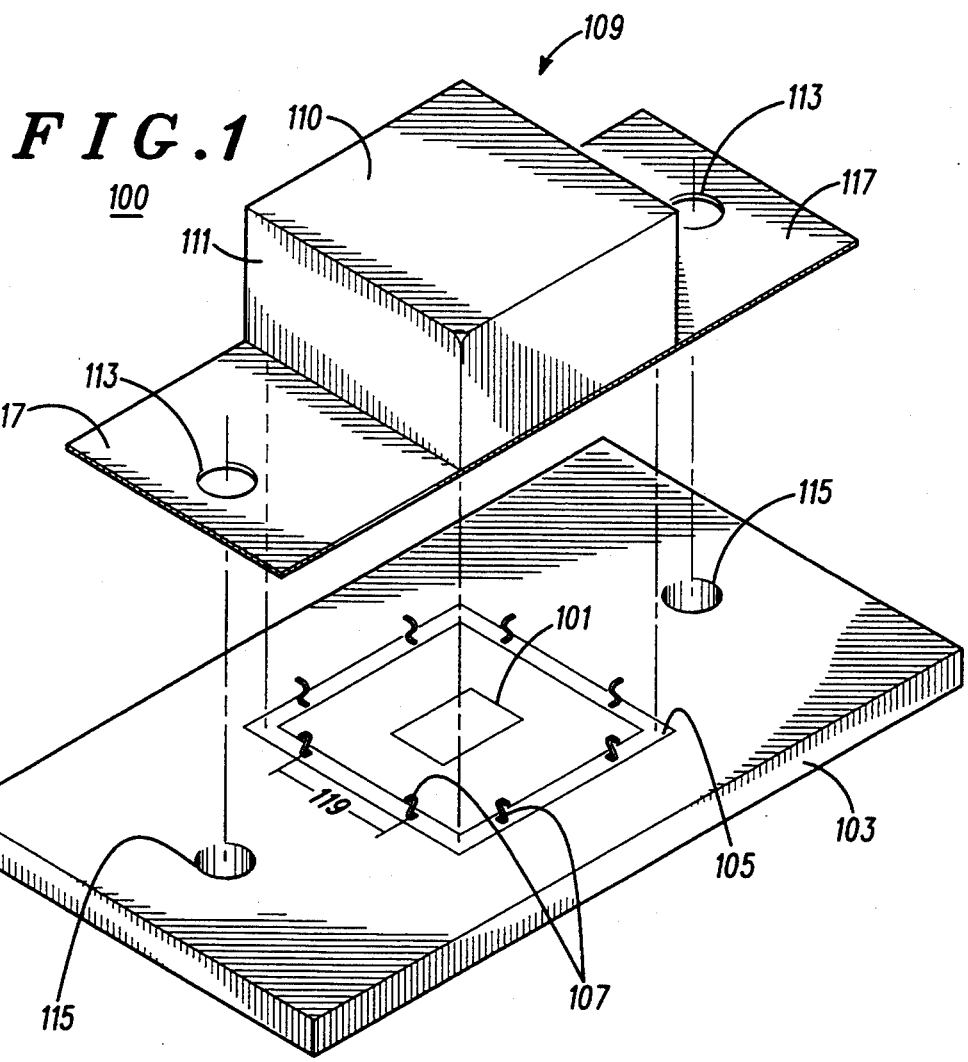
FIG. 1 illustrates an exploded perspective view of an electromagnetic shielding assembly, in accordance with a preferred embodiment of the present invention.

The present invention can be more fully described with reference to FIGS. 1–3. FIG. 1 illustrates an exploded perspective view of an electromagnetic shielding assembly 100, in accordance with a preferred embodiment of the present invention. The electromagnetic shielding assembly 100 comprises a receptacle area 105 disposed on a substrate 103, a plurality of compressible, electrically conductive contacts 107, and a shielding enclosure 109 having a top portion 110 and a plurality of side portions 111. The receptacle area 105 encircles an electrical circuit 101 such that when the shielding enclosure 109 is positioned upon the contacts 107, the preferred electromagnetic shielding assembly 100 substantially encloses the electrical circuit 101. Mounting holes 113, 115 might be included in the shielding enclosure 109 and in the substrate 103, respectively, to facilitate attachment of the shielding enclosure 109 to the substrate 103.

The electrical circuit 101 might comprise one or more of a variety of circuits, such as oscillators, filters, or amplifiers and might include discrete and/or distributed components, such as capacitors, inductors, transistors, transmission lines, distributed capacitances, or distributed inductances. Depending on its composition, the electrical circuit 101 might emit, or be susceptible to, electromagnetic energy. The substrate 103 preferably comprises a printed circuit board material, such as FR4, cyanate ester, teflon, or alumina ceramic.

In a preferred embodiment, the receptacle area 103 comprises a planar, continuous metallic trace having a width large enough to support a substantially planar bottom portion of each contact 107. In addition, the receptacle area 105 might include a plurality of electrically conductive throughholes (not shown) that provide electrical connectivity between the planar surface of the receptacle area 105 and a ground plane attached to the underside of the substrate 103. In the preferred embodiment, the receptacle area 105 is tin-plated to enhance solderability of the compressible contacts 107 thereto. In an alternate embodiment, the receptacle area 105 might comprise a plurality of traces, wherein each trace is separated from an adjacent trace by a predetermined distance (e.g., one-quarter wavelength of an operating frequency of the electrical circuit 101) that provides sufficient shielding of the electrical circuit 101. The receptacle area 105 is preferably rectangular in geometry and completely encircles the electrical circuit 101 as shown. However, it is well understood that the geometry of the receptacle area 105 and the amount of circuit encirclement required by the receptacle area 105 are dictated by the shielding effectiveness desired by the particular electromagnetic shielding assembly. Procedures for fabricating the receptacle area 105 onto the substrate 103 are well known in the art, thus no further discussion will be presented except to facilitate an understanding of the present invention.

Each of the compressible contacts 107 preferably comprises an effectively Z-shaped element constructed of a tin-plated, beryllium copper alloy. The preferred contact 107 is detailed below with regard to FIG. 2. In an alternate embodiment, each compressible contact 107 might comprise a conventional coiled spring, wherein one end of the spring is substantially planar to allow the spring to be positioned upon the receptacle area 105 of the substrate 103. What is important is that each contact 107 be compressible to provide electrical connectivity between the side portions 111 and the receptacle area 105 over a nominal range of height tolerances of the side portions 111.

As mentioned above, the shielding enclosure 109 includes a top portion 110 and a plurality of side portions 111 extending downwardly from the top portion 110. In a preferred embodiment, the shielding enclosure 109 comprises a substantially solid aluminum enclosure having the top portion 110 integrally disposed with the side portions 111. In an alternate embodiment, the shielding enclosure 109 might be fabricated by machining a metal, a metallically coated plastic, or an electrically conductive carbon composition into a rectangular geometry. In any one of these alternate embodiments, the shielding enclosure 109 might further include flange portions 117 that contain mounting holes 113. The mounting holes 113 would facilitate fastening of the shielding enclosure 109 to the substrate 103 via corresponding mounting holes 115 in the substrate 103. In yet another embodiment, the flange portions 117 of the shielding enclosure 109 might be fastened to the substrate 109 with one or more clips to facilitate expedient removal of the shielding enclosure 109.

The electrical circuit 101 is shielded by the electromagnetic shielding assembly 100 in the following manner. The compressible contacts 107 are positioned upon the the substrate 103 such that their substantially planar portions are in physical contact with the receptacle area 105. In a preferred embodiment, the contacts 107 are automatically placed upon the receptacle area 105 using a FUJI CP III or IV High Speed Chip Shooter, or a comparable, automated pick and place machine. In the alternative, manual placement of the compressible contacts 107 is possible, though less preferred since manual placement inherently contains a higher probability of placement errors than does automated placement. In a preferred embodiment, the contacts 107 are uniformly separated upon the receptacle area 105 by a distance 119 of not more than one-quarter wavelength of the highest frequency that the electromagnetic shielding assembly 100 is to effectively attenuate.

Upon placing the contacts 107 onto the receptacle area 105, the planar portion of each contact 107 is electrically coupled to the receptacle area 105. In a preferred embodiment, the planar portions of the contacts 107 are soldered onto the receptacle area 105 using well-known infra-red (IR) reflow soldering techniques. This soldering can be done simultaneously with the soldering of any discrete components used in the electrical circuit 101. Thus, the present invention facilitates simultaneous attachment of a base portion (i.e., the plurality of contacts 107) of the electromagnetic shielding assembly 100 and the components of the electrical circuit 101, in contrast to the multiple step processes (i.e., waveline soldering of the shield base and reflow soldering of the circuit components) of the prior art. In an alternate embodiment, the contacts 107 might be coupled to the receptacle area 105 with conductive epoxy.

After the contacts 107 are electrically coupled to the receptacle area 105, the shielding enclosure 109 is positioned upon the compressible contacts 107 and urged toward the substrate 103 such that the side portions 111 of the shielding enclosure 109 compress the contacts 107. Once compressed, the contacts 107 provide a multiple point electrical connection between the shielding enclosure 109 and the receptacle area 105, which is preferably at ground potential. Once the shielding enclosure 109 is attached to the contacts 107, the electromagnetic shielding assembly 100 substantially encloses the electrical circuit 101. In the preferred embodiment, the shielding assembly 100 does not completely encase the electrical circuit 101 due to the apertures formed by the spacing of the contacts 107; however, if a single contact having a geometry substantially identical to that of the receptacle area 105 is used, a complete enclosure of the circuit 101 might be attainable.

Figure 2:
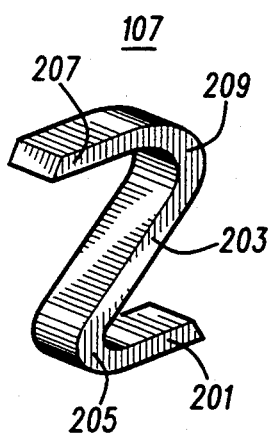
FIG. 2 illustrates a perspective view of a preferred compressible, electrically conductive contact, in accordance with the present invention.

FIG. 2 illustrates a perspective view of a preferred compressible, electrically conductive contact 107, in accordance with the present invention. The contact 107 is effectively Z-shaped as shown and includes substantially planar bottom and top portions 201, 207, a central portion 203, and two essentially C-shaped portions 205, 209. The bottom planar portion 201 is physically coupled to the central portion 203 by the C-shaped portion 205. Similarly, the planar top portion 207 is physically coupled to the central portion 203 by the C-shaped portion 209. As briefly mentioned above, the preferred contact 107 is constructed of a tin-plated, beryllium copper alloy and occupies a base area of 2.5 square millimeters. The preferred contact 107 is fabricated by mechanically forming and thermally hardening the beryllium copper alloy into the Z-shape. It should be noted that the contact 107 might alternatively have an extended C-shape. That is, the contact 107 might include only the bottom portion 201, the central portion 203, and the C-shaped portion 205.

When the side portions 111 of the shielding enclosure 109 are urged toward the substrate 103, as discussed above, the C-shaped portion 209 of each contact 107 moves downward. This movement causes the central portion 203 of each contact 107 to become substantially parallel to the top and bottom portions 207, 201 of each contact 107 once the contacts 107 reach their compressed state. While being compressed, each contact 107 exerts an upward force on its corresponding side portion 111, thereby providing physical and electrical contact between the top portion 207 of each contact 107 and the corresponding side portion 111 of the shielding enclosure 109. The Z-shape of the preferred contact 107 accounts for height tolerances in the side portions 111, while allowing the contact 107 to maintain a reliable electrical connection with the corresponding side portion 111 over a wide range of operating temperatures.

Figure 3:
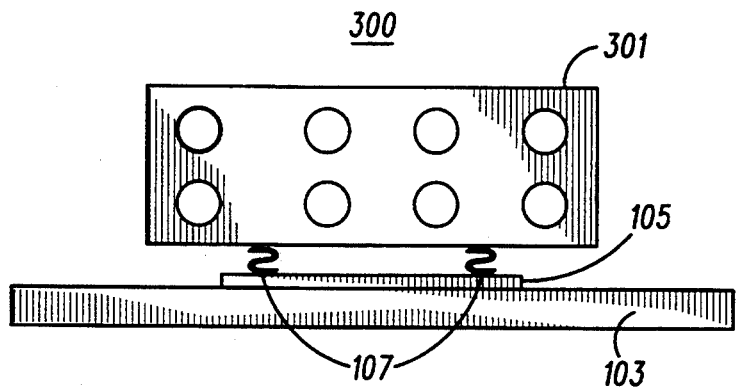
FIG. 3 illustrates a side view of an assembled electromagnetic shielding assembly, in accordance with an alternate embodiment of the present invention.

FIG. 3 illustrates a side view of an assembled electromagnetic shielding assembly 300, in accordance with an alternate embodiment of the present invention. The assembled shielding assembly 300 includes a shielding enclosure 301, the plurality of compressible, electrically conductive contacts 107 (shown in a compressed state), and the receptacle area 105 disposed on the substrate 103. In this embodiment, the shielding enclosure 301 comprises a perforated enclosure having integrally disposed top and side portions. The perforated enclosure 301 permits the components to be at least partially viewed (e.g., for inspection by an assembly operator) while the enclosure 301 is positioned upon the contacts 107.

The present invention encompasses a method and apparatus for providing electromagnetic shielding of an electrical circuit that is disposed on a substrate. With this invention, a base portion of an electromagnetic shielding assembly can be automatically placed upon a receptacle area of the substrate concurrently with the placement of discrete components onto the substrate.

Thus, the present invention obviates the need for manual placement of the shielding assembly prior to reflow soldering. In addition, the present invention permits the circuit components and the base portion of the shielding assembly to be simultaneously reflow soldered, in contrast to the combined waveline/reflow soldering techniques used to attach the base portions of various prior art electromagnetic shielding assemblies. Further, the present invention facilitates removal of the shielding enclosure without requiring any de-soldering operation, in contrast with the de-soldering operation required to remove reflowed single piece shields of the prior art.

What is claimed is:

1. A method for providing electromagnetic shielding of an electrical circuit that is disposed on a substrate, the method comprising the steps of:
    a) providing at least one compressible, electrically conductive, essentially Z-shaped contact that includes a substantially planar first portion;
    b) conductively affixing, substantially simultaneously with the disposition of the electrical circuit on the substrate, the substantially planar first portion of the at least one compressible, electrically conductive essentially Z-shaped contact to at least one receptacle area on the substrate that substantially encircles the electrical circuit; and
    c) positioning a shielding enclosure that includes a top portion and a plurality of side portions upon the at least one compressible, electrically conductive essentially Z-shaped contact such that the plurality of side portions compress removably against the at least one compressible, electrically conductive essentially Z-shaped contact to substantially enclose the electrical circuit.

2. The method of claim 1, wherein step (a) comprises the step of providing a plurality of compressible, electrically conductive essentially Z-shaped contacts that each includes a substantially planar first portion.

3. The method of claim 2, wherein step (b) comprises the step of coupling the substantially planar first portion of each of the plurality of compressible, electrically conductive essentially Z-shaped contacts to the at least one receptacle area.

4. The method of claim 3, wherein step (b) comprises the step of soldering the substantially planar first portion of each of the plurality of compressible, electrically conductive essentially Z-shaped contacts to the at least one receptacle area.

5. The method of claim 3, wherein step (c) comprises the step of positioning the shielding enclosure upon the plurality of compressible, electrically conductive essentially Z-shaped contacts such that the plurality of side portions compress at least some of the plurality of compressible, electrically conductive contacts to substantially enclose the electrical circuit.

6. The method of claim 1, wherein step (b) further comprises the step of automatically placing the at least one compressible, electrically conductive essentially Z-shaped contact onto the at least one receptacle area.

* * * * *